United States Patent
Mao et al.

(10) Patent No.: US 7,888,215 B2
(45) Date of Patent: Feb. 15, 2011

(54) CMOS IMAGE SENSOR WITH HIGH FULL-WELL-CAPACITY

(75) Inventors: Duli Mao, Sunnyvale, CA (US); Hsin-Chih Tai, Cupertino, CA (US); Vincent Venezia, Sunnyvale, CA (US); Yin Qian, Milpitas, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 311 days.

(21) Appl. No.: 12/133,217

(22) Filed: Jun. 4, 2008

(65) Prior Publication Data

US 2009/0302358 A1    Dec. 10, 2009

(51) Int. Cl.
   *H01L 21/336* (2006.01)
(52) U.S. Cl. ............... 438/286; 438/48; 438/57; 438/59; 438/197; 257/E31.11
(58) Field of Classification Search ........ 257/288, 257/290, 291, 292, 431, 436, 461, 462, E31.001, 257/E31.052, E31.054, E31.057, E31.079, 257/E31.082, E31.11; 438/48, 57, 59, 98, 438/197, 286

See application file for complete search history.

(56) References Cited

U.S. PATENT DOCUMENTS

| | | | |
|---|---|---|---|
| 6,967,364 B2 | 11/2005 | Hong | |
| 7,154,137 B2 | 12/2006 | Nozaki | |
| 7,226,803 B2 | 6/2007 | Mouli et al. | |
| 7,459,360 B2 * | 12/2008 | Adkisson et al. | 438/199 |
| 2005/0164440 A1 * | 7/2005 | Yaung et al. | 438/197 |
| 2007/0012863 A1 * | 1/2007 | Han | 250/208.1 |
| 2007/0072325 A1 | 3/2007 | Rhodes | |
| 2007/0145443 A1 * | 6/2007 | Lim | 257/292 |

* cited by examiner

*Primary Examiner*—Evan Pert
*Assistant Examiner*—Eduardo A Rodela
(74) *Attorney, Agent, or Firm*—Blakely Sokoloff Taylor & Zafman LLP

(57) ABSTRACT

An image sensor with a high full-well capacity includes a photosensitive region, a transfer gate, and sidewall spacers. The photosensitive region is formed to accumulate an image charge in response to light. The transfer gate disposed adjacent to the photosensitive region and coupled to selectively transfer the image charge from the photosensitive region to other pixel circuitry. First and second sidewall spacers are disposed on either side of the transfer gate. The first sidewall spacer closest to the photosensitive region is narrower than the second sidewall spacer. In some cases, the first sidewall spacer may be omitted.

11 Claims, 8 Drawing Sheets

CMOS IMAGE SENSOR WITH HIGH FULL-WELL-CAPACITY

TECHNICAL FIELD

This disclosure relates generally to image sensors, and in particular but not exclusively, relates to CMOS image sensors having a high full-well-capacity.

BACKGROUND INFORMATION

Image sensors have become ubiquitous. They are widely used in digital still cameras, cellular phones, security cameras, as well as, medical, automobile, and other applications. The technology used to manufacture image sensors, and in particular, complementary metal-oxide-semiconductor ("CMOS") image sensors ("CIS"), has continued to advance at great pace. For example, the demands of higher resolution and lower power consumption have encouraged the further miniaturization and integration of these image sensors.

Figure 1:
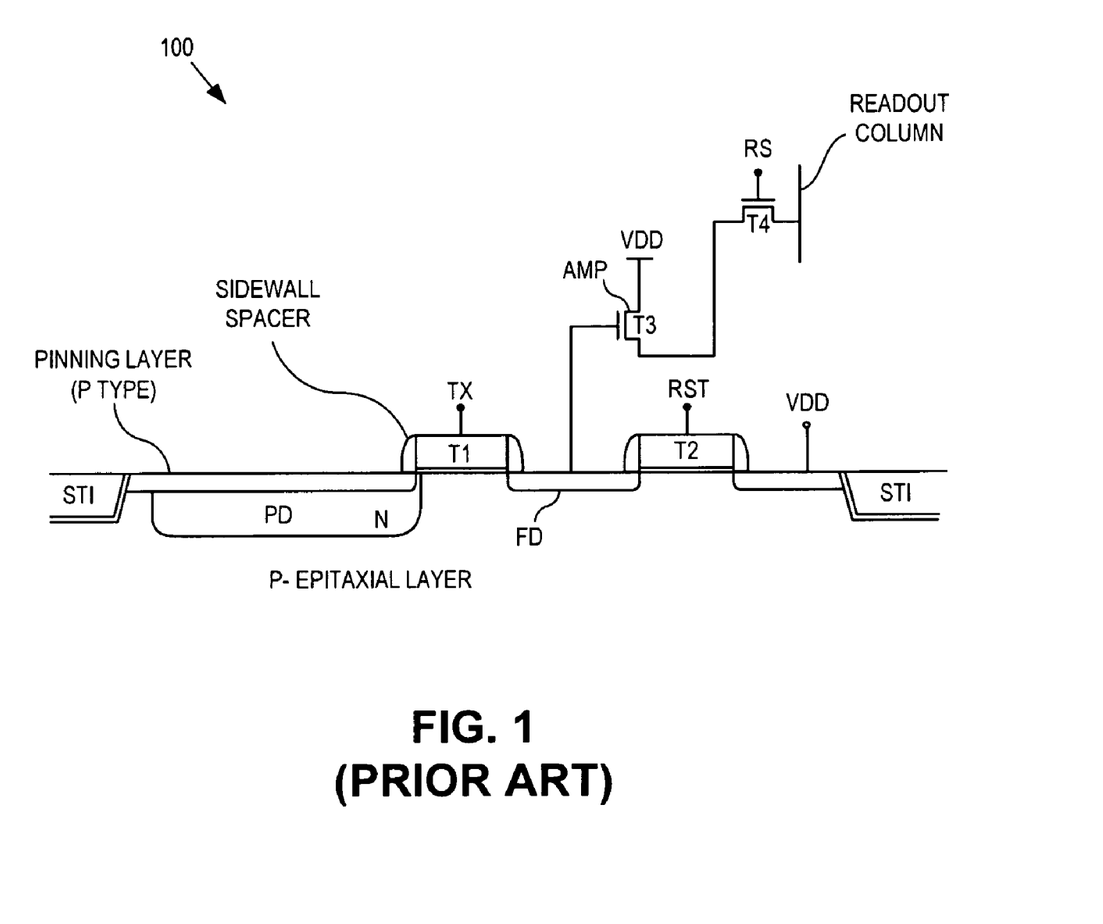
FIG. 1 is a cross-sectional view of a conventional four transistor (4T) imaging pixel.

FIG. 1 shows a cross-sectional view of a conventional active pixel cell 100 that uses four transistors. This is known in the art as a 4T pixel cell. 4T pixel cell 100 includes a photodiode PD, a transfer transistor T1, a reset transistor T2, a source-follower ("SF") or amplifier ("AMP") transistor T3, and a row select ("RS") transistor T4.

During operation, transfer transistor T1 receives a transfer signal TX, which transfers the charge accumulated in photodiode PD to a floating drain/diffusion node FD. Reset transistor T2 is coupled between a power rail VDD and the node FD to reset the pixel (e.g., discharge or charge the FD and the PD to a preset voltage) under control of a reset signal RST. The node FD is coupled to control the gate of AMP transistor T3. AMP transistor T3 is coupled between the power rail VDD and RS transistor T4. AMP transistor T3 operates as a source-follower providing a high impedance connection to the floating diffusion FD. Finally, RS transistor T4 selectively couples the output of the pixel circuitry to the readout column line under control of a signal RS. Often the photodiode PD of a pixel cell is passivated with a shallow pinning layer to reduce surface defects. In an example where an N type PD is implanted into a P-epitaxial layer, the pinning is formed by a shallow P type implant.

In normal operation, the photodiode PD and node FD are reset to the supply voltage VDD by temporarily asserting the reset signal RST and the transfer signal TX. The image accumulation window (exposure period) is commenced by de-asserting the transfer signal TX and permitting incident light to charge the photodiode PD. As photogenerated electrons accumulate on the photodiode PD, its voltage decreases (electrons are negative charge carriers). The voltage or charge on photodiode PD is indicative of the intensity of the light incident on the photodiode PD during the exposure period. At the end of the exposure period, the reset signal RST is de-asserted to isolate node FD and the transfer signal TX is asserted to couple the photodiode to node FD and hence the gate of AMP transistor T3. The charge transfer causes the voltage of node FD to drop from VDD to a second voltage indicative of the amount of charge (e.g., photogenerated electrons accumulated on the photodiode PD during the exposure period). This second voltage biases AMP transistor T3, which is coupled to the readout column line when the signal RS is asserted on RS transistor T4.

As the pixel-size of CIS become smaller for higher pixel density and lower cost, the active area of the PD has also been reduced. For pinned photodiodes, which are commonly used for CIS, the smaller photodiode area leads to a smaller full-well-capacity (the maximum charge that the PD can hold). The reduced full-well-capacity means lower dynamic range and lower signal-to-noise ratio. Therefore, it is often desirable to increase the full-well-capacity of a pinned photodiode.

In a p-n-p pinned photodiode (illustrated) most commonly used for CIS, a common way to increase the full-well-capacity is to increase the doping level of the N-type PD region by increasing the implantation dosage. However, the N type doping level cannot be too high without causing significant image lag, diode leakage current, and other defect pixels (commonly referred to as white pixels).

Multiple p-n-p-n junctions have been proposed to increase the size of the PD region for charge storage and therefore the full-well-capacity. With optimized implants and layout, a full-well-capacity increase of 50% has been demonstrated without increase in pinning voltage or image lag.

Other techniques for increasing the full-well-capacity have also been suggested. For example, it has been proposed to use solid source diffusion (SSD) or plasma doping to form ultra-shallow junctions. The claimed benefit of these techniques is to reduce the surface P type layer thickness and improve blue sensitivity. Another related technique is to grow epitaxial silicon selectively over the surface of the PD to reduce image lag. While it may be possible that these techniques result in high photodiode capacitance, they also introduce additional thermal fabrication steps that can degrade logic circuit performance. The benefit to increasing the PD full well capacity may be limited because thermal diffusion often leads to long dopant tails and therefore reduced capacitance.

Figure 2A:
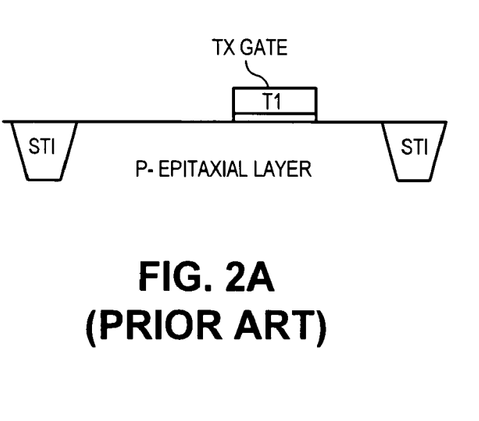
FIGS. 2A-D are cross-sectional views illustrating a conventional technique for fabricating a 4T imaging pixel.
Figure 2B:
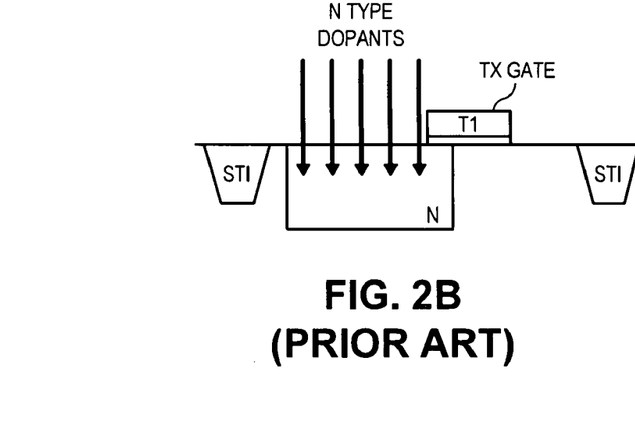
Figure 2C:
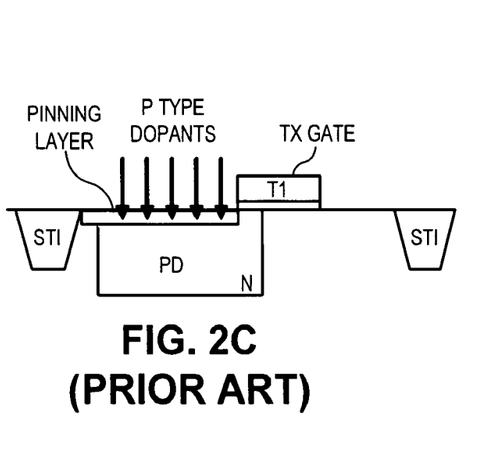
Figure 2D:
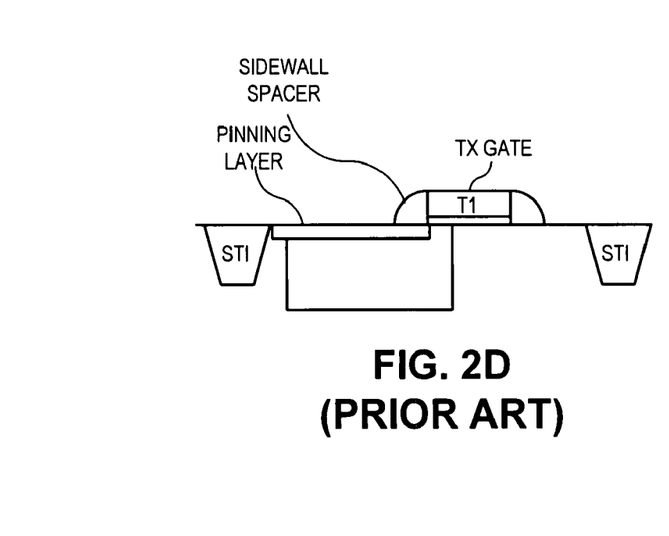

FIGS. 2A through 2D illustrate the conventional process for fabricating a CIS. After the gate layer (e.g., transistors T1-T4) has been formed (FIG. 2A; only the transfer gate is illustrated), the PD region is implanted next to the gate of the transfer transistor T1 (FIG. 2B). After the PD region is implanted, but before the sidewall spacers of the transfer transistors are formed, the pinning layer is implanted (FIG. 2C). This order of fabrication provides pinning under the sidewall spacers, which helps to reduce dark current and white pixels. However, the thermal processing for sidewall spacer formation (FIG. 2D) also causes the P type dopants of the pinning layer to diffuse, resulting in a less abrupt p-n junction and therefore a lower full-well-capacity.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and method for fabricating a CMOS image sensor having a high full-well-capacity are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 3:
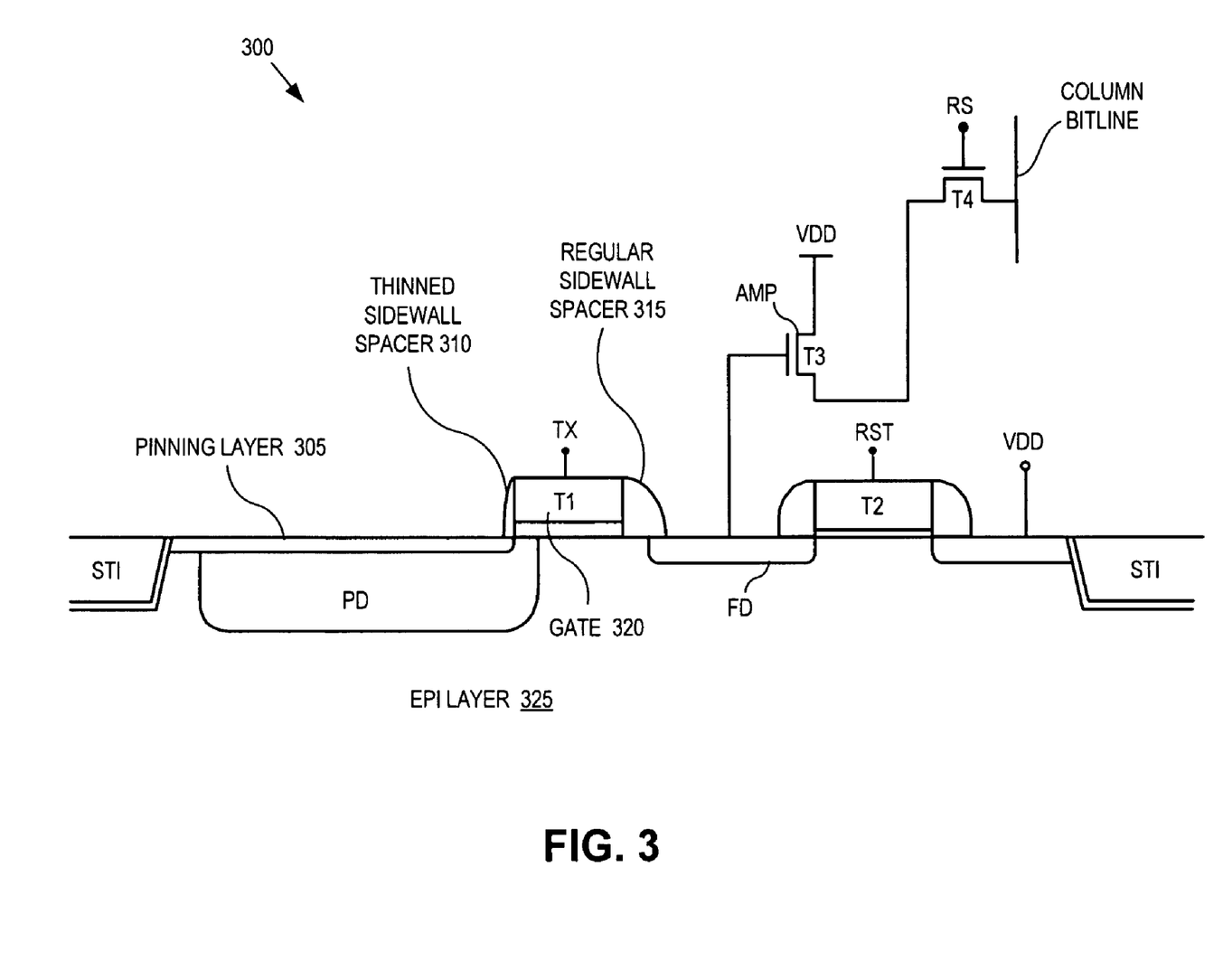
FIG. 3 is a cross-sectional view of a portion of an image sensor having a high full-well-capacity, in accordance with an embodiment of the invention.

FIG. 3 is a cross-sectional view of an image sensor 300 having a high full-well-capacity, in accordance with an embodiment of the invention. Image sensor 300 is illustrated with a four transistor ("4T") pixel architecture; however, it should be appreciated that embodiments of the invention are equally applicable to other pixel architectures such as 5T, 6T, or otherwise.

The illustrated embodiment of image sensor 300 includes a photodiode PD, a transfer transistor T1, a floating diffusion node FD, a reset transistor T2, a source-follower ("SF") or amplifier ("AMP") transistor T3, a row select ("RS") transistor T4, and a pinning layer 305. The illustrated embodiment of transfer transistor T1 includes a thinned sidewall spacer 310, a regular sidewall spacer 315, and a gate 320. In one embodiment, image sensor 300 is formed on a P-epitaxial layer 325 with a N type doped PD and a P type pinning layer 305. However, it should be appreciated that embodiments of the invention are equally applicable to image sensors having P type PD regions formed in an N-epitaxial layer. Although FIG. 3 illustrates a single image sensor, it should be appreciated that the structure of image sensor 300 may be replicated in a grid-like pattern to form a CMOS imaging array where each pixel is separated from adjacent pixels by shallow trench isolations ("STI") (e.g., see FIG. 7).

Embodiments of the present invention facilitate a very shallow pinning layer 305 having an abrupt p-n junction (dopant profile). The abrupt p-n junction is achieved with the addition of only one masking step and no thermal processing changes to the CMOS process. The shallow depth and abrupt junction of pinning layer 305 has the overall effect of increasing the full-well-capacity of image sensor 300 versus conventional image sensors.

In one embodiment, the shallow depth and abrupt junction of pinning layer 305 is achieved by implanting pinning layer 305 after formation of sidewall spacers 310 and 315. Reordering pinning layer 305 implantation after sidewall spacer formation improves the fidelity of the p-n junction because sidewall spacer formation is a relatively high temperature processing step, which cause dopant diffusion and a less abrupt boundary of the p-n junction. To compensate for process reordering, thinned sidewall spacer 310 is thinned relative to regular sidewall spacer 315. If not thinned, a pinning layer gap would be left under the sidewall spacer adjacent to the PD, which could increase the incidence of dark current and white pixels. In some embodiments, thinned sidewall spacer 310 could be entirely removed so that the side of transfer gate 320 adjacent to the PD is not covered by a sidewall spacer.

In one embodiment, sidewalls spacers 310 and 315 are formed from a multilayer spacer film (e.g., oxide-nitride-oxide multilayer film) and etched in a manner such that thinned sidewall spacer 310 is significantly narrower than regular sidewall spacer 315. In one embodiment thinned sidewall spacer 310 is at least 2 or 3 times narrower than regular sidewall spacer 315. For example, thinned sidewall spacer 310 may be only 300 angstroms wide.

Figure 4:
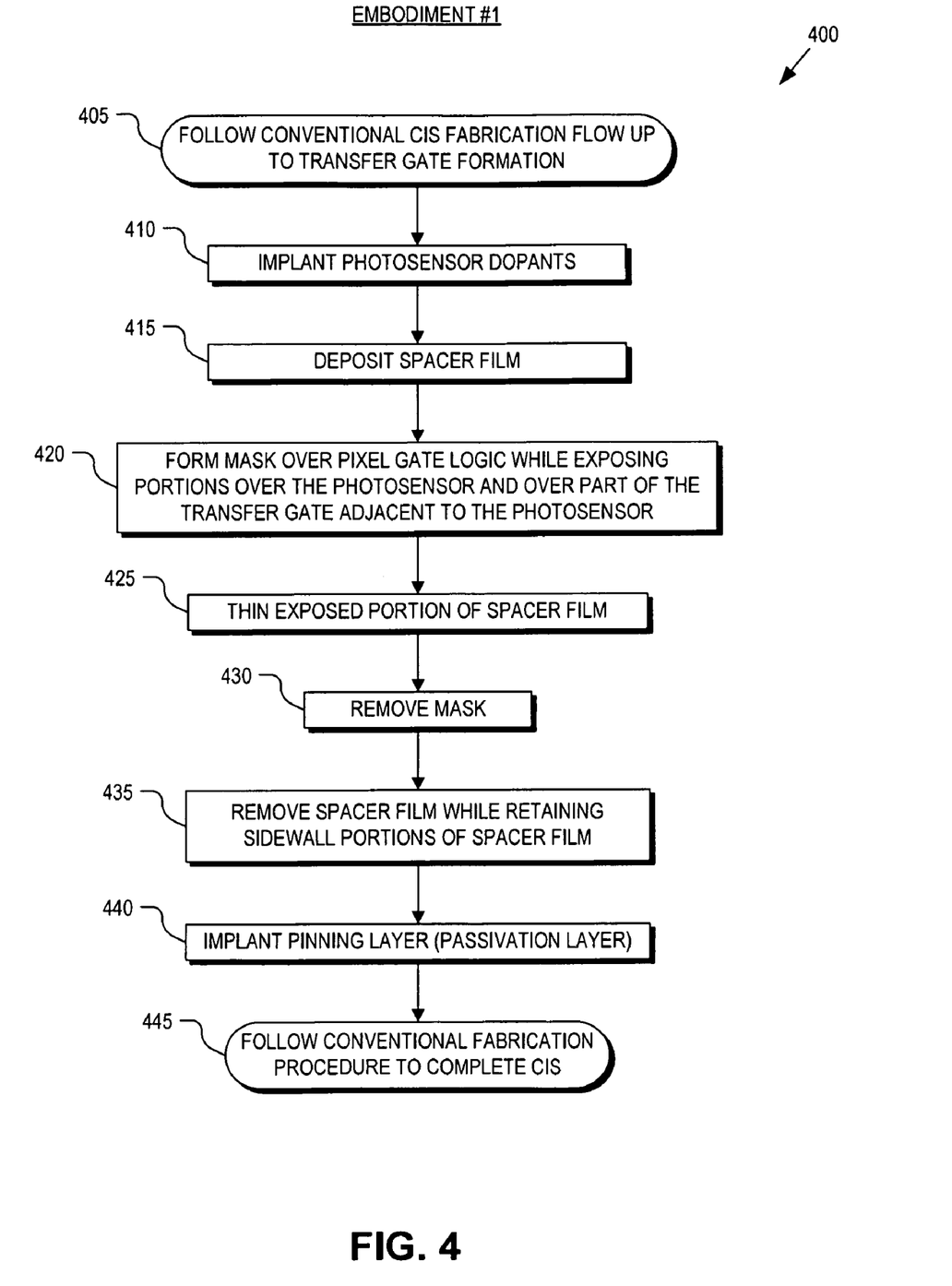
FIG. 4 is a flow chart illustrating a process for fabricating an image sensor having a high full-well-capacity, in accordance with an embodiment of the invention.

FIG. 4 is a flow chart illustrating a process 400 for fabricating image sensor 300 having a high full-well-capacity, in accordance with an embodiment of the invention. The order in which some or all of the process blocks appear in process 400 should not be deemed limiting. Rather, one of ordinary skill in the art having the benefit of the present disclosure will understand that some of the process blocks may be executed in a variety of orders not illustrated.

Figure 5A:
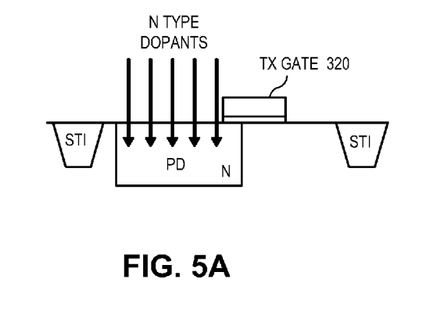
FIGS. 5A-D are cross-sectional views of a portion of an image sensor having a high full-well-capacity at various stages of fabrication, in accordance with an embodiment of the invention.

In a process block 405, conventional CMOS image sensor ("CIS") fabrication flow is followed up to formation of pixel circuitry formation (including transfer gate 320). In a process block 410, photosensor PD is formed (see FIG. 5A). In one embodiment, the PD region may be implanted with N type dopants to form an N type doped PD region.

Figure 5B:
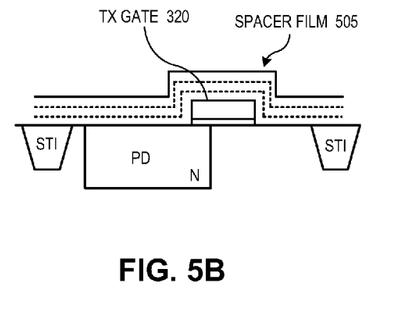

In a process block 415, a spacer film 505 is conformally formed over the top surface of the pixel including transfer gate 320 and the PD region (see FIG. 5B). Spacer film 505 may be formed of a variety of insulating materials. In one embodiment, spacer film 505 is a multilayer film formed by sequentially depositing layers of oxide-nitride-oxide (illustrated in FIG. 5B with dashed lines).

Figure 5C:
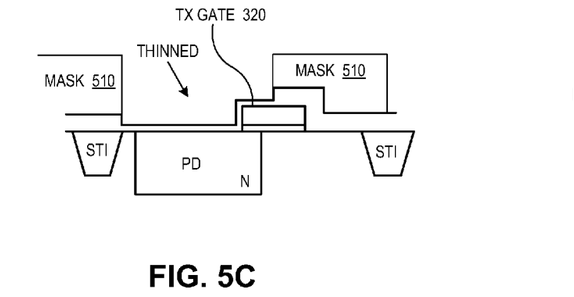

In a process block 420, a photolithography and etching mask 510 is formed over the surface of the pixel to protect the pixel circuitry (floating diffusion, AMP transistor, reset transistor, RS transistor) and peripheral logic circuitry while exposing the PD region and a portion of transfer gate 320 adjacent to the PD region (see FIG. 5C). Once mask 510 has been patterned, the exposed portions of spacer film 505 are etched (process block 425). As illustrated in FIG. 5C, the exposed portion of spacer film 505 is thinned. In one embodiment, spacer film 505 is thinned by removing the top layer of oxide from the multilayer oxide-nitride-oxide spacer film.

Figure 5D:
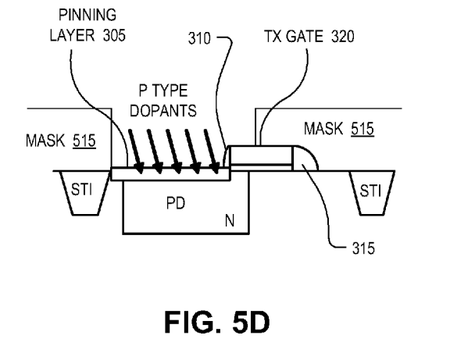

After thinning the exposed portions of spacer film 505, mask 510 is removed (process block 430) and the normal spacer dry etch is performed to form sidewall spacers 310 and 315 (process block 435). Since the portion of spacer film 505 lapping over the corner of transfer gate 320 adjacent to the PD region was already thinned, spacer 310 is significantly narrower than spacer 315 after the spacer etch. For example, regular sidewall spacer 315 may be 2 or 3 times wider than thinned sidewall spacer 310. Of course, other relative widths, either greater or lesser, may be used as well. In one embodiment, thinned sidewall spacer 310 is approximately 300 angstroms wide.

In a process block 440, a doping mask 515 is formed and pinning layer 305 implanted to passivate the surface of the PD region. In one embodiment, the dopants are implanted at a small angle (e.g., 5 to 10 degrees) so that pinning layer 305 extends under thinned sidewall spacer 310. Finally, conventional CIS fabrication procedures are followed to completion.

These final processes may include source/drain implantation, source/drain anneal, silicidation, formation of the backend metal stack, polymer planarization, microlens formation, and otherwise. Alternatively, implantation of pinning layer 305 may be performed after source/drain anneal, but prior to the salicidation anneal in order to further preserve the pinning profile.

In an alternative embodiment, mask 510 may be used as both an etching mask and doping mask. In this alternative embodiment, mask 515 is not used and pinning layer 305 is implanted prior to removal of mask 510. Instead, the pinning layer dopants are implanted through the thinned portion of spacer film 505 prior to the spacer etch performed in process block 435.

Since process 400 moves formation of pinning layer 305 to a later fabrication stage after the high temperature deposition of spacer film 505, process 400 generates a shallow pinning layer 305 and an abrupt p-n junction over the PD region. Additionally, a small increase in the light transmission into the PD region is achieved due to the thinning of sidewall spacer 310.

Figure 6:
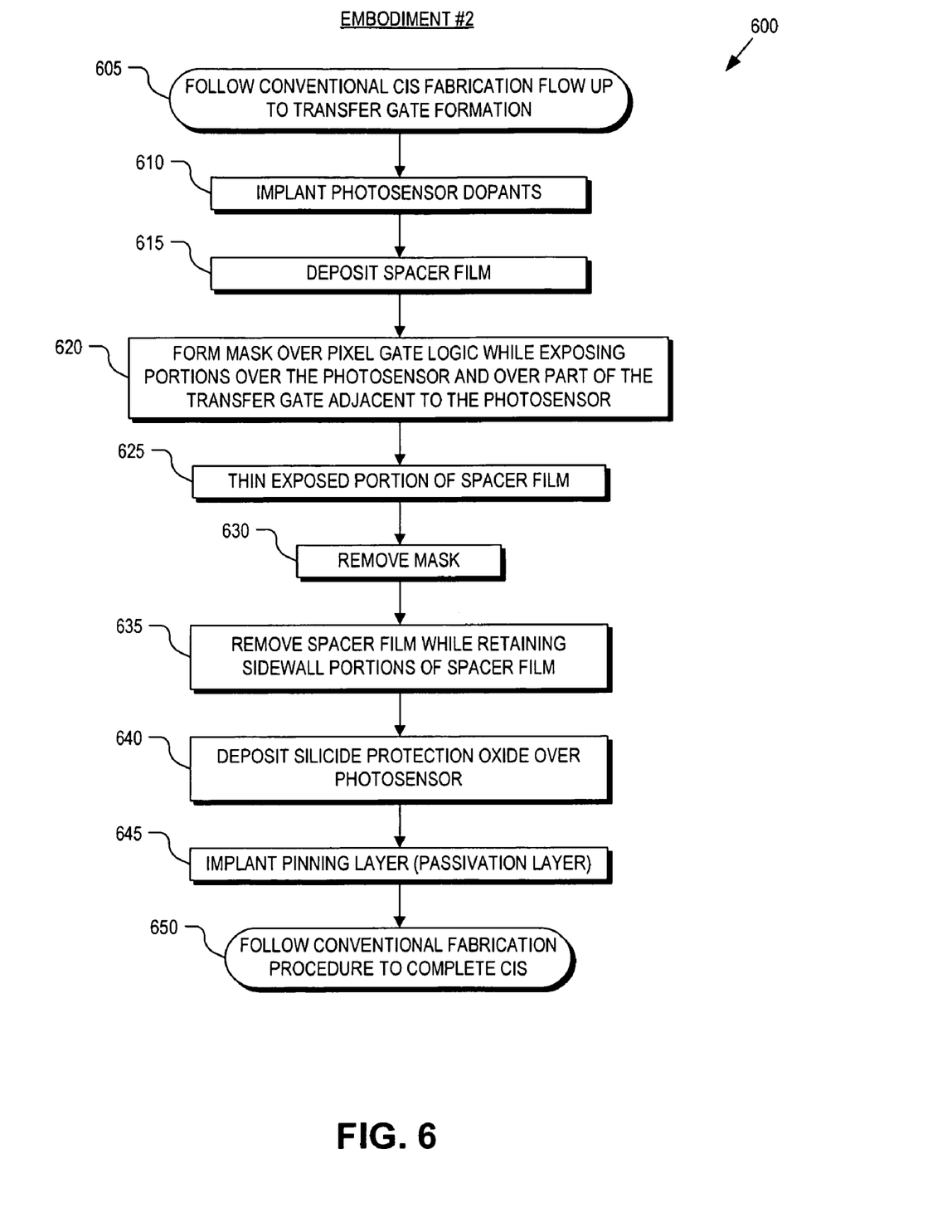
FIG. 6 is a flow chart illustrating an alternative process for fabricating an image sensor having a high full-well-capacity, in accordance with an embodiment of the invention.

FIG. 6 is a flow chart illustrating an alternative process 600 for fabricating image sensor 300 having a high full-well-capacity, in accordance with an embodiment of the invention. Again, the order in which some or all of the process blocks appear in process 600 should not be deemed limiting. Rather, one of ordinary skill in the art having the benefit of the present disclosure will understand that some of the process blocks may be executed in a variety of orders not illustrated.

Process 600 is the same as process 400 up to and including process block 635, with the exception of process block 625. In process block 625, the exposed portion of spacer film 505 is completely removed, as opposed to merely thinned. However, in one embodiment of process 400, spacer film 505 is also completely removed in the exposed portions, except for the immediately adjacent to the sidewall of transfer gate 320.

In a process block 640, a silicide protection oxide is formed over the PD region using a low temperature chemical vapor deposition ("CVD") technique. In a process block 645, pinning layer 305 is implanted into the interface between the silicide protection oxide and the top surface of the PD region. The implant energy can be chosen to place the dopant profile peak at the silicon-oxide interface. This helps reduce the thickness of pinning layer 305 and enhance collection of blue light for a front-side illumination configuration. Accordingly, in this alternative embodiment, the pinning implant is performed after deposition of the silicide protection oxide to further enhance the fidelity of the p-n junction between pinning layer 305 and the PD region.

Finally, in a process block 650, conventional CIS fabrication procedures are followed to completion. These final processes may include source/drain implantation, source/drain anneal, silicide anneal, formation of the backend metal stack, polymer planarization, microlens formation, and otherwise.

Figure 7:
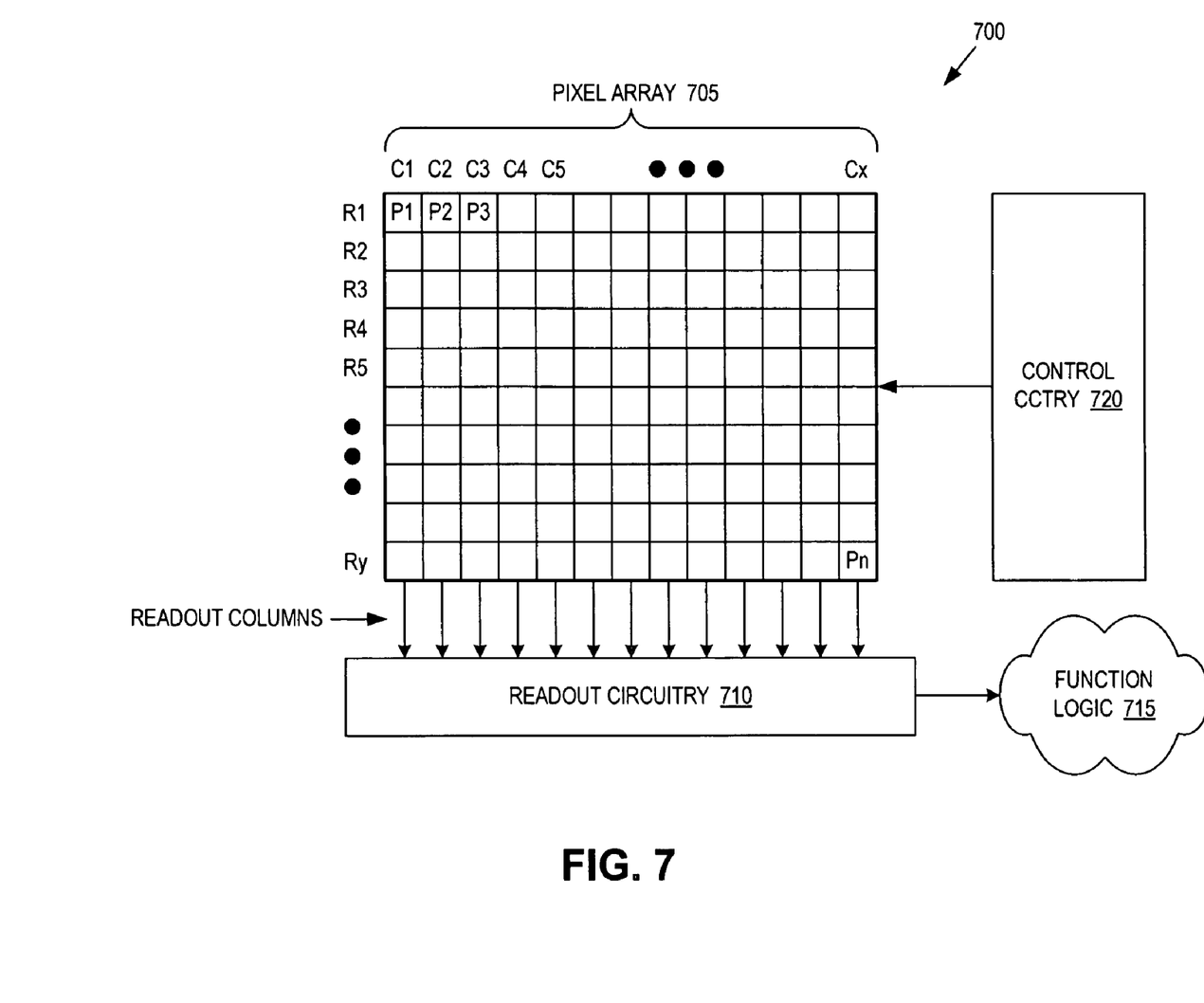
FIG. 7 is a block diagram illustrating an imaging system, in accordance with an embodiment of the invention.

FIG. 7 is a block diagram illustrating an imaging system 700, in accordance with an embodiment of the invention. The illustrated embodiment of imaging system 700 includes an image sensor array 705, readout circuitry 710, function logic 715, and control circuitry 720.

Image sensor array 705 is a two-dimensional ("2D") array of image sensors or pixels (e.g., pixels P1, P2 . . . , Pn). In one embodiment, each pixel P1-Pn may be implemented with a high full-well-capacity image sensor, such as image sensor 300 illustrated in FIG. 3. In one embodiment, each pixel is a complementary metal-oxide-semiconductor ("CMOS") imaging pixel. Image sensor array 705 may be implemented as either a front side illuminated image sensor array or a backside illuminated image sensor array. In one embodiment, image sensor array 705 includes a color filter pattern, such as a Bayer pattern or mosaic of red, green, and blue additive filters (e.g., RGB, RGBG or GRGB), a color filter pattern of cyan, magenta, yellow, and key (black) subtractive filters (e.g., CMYK), a combination of both, or otherwise. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 710 and transferred to function logic 715. Readout circuitry 710 may include amplification circuitry, analog-to-digital ("ADC") conversion circuitry, or otherwise. Function logic 715 may simply store the image data or even manipulate the image data by applying post image effects (e.g., crop, rotate, remove red eye, adjust brightness, adjust contrast, or otherwise). In one embodiment, readout circuitry 710 may readout a row of image data at a time along readout column lines (illustrated) or may readout the image data using a variety of other techniques (not illustrated), such as a column readout, a serial readout, or a full parallel readout of all pixels simultaneously.

Control circuitry 720 is coupled to image sensor array 705 to control operational characteristic of image sensor array 705. For example, control circuitry 720 may generate a shutter signal for controlling image acquisition. In one embodiment, the shutter signal is a global shutter signal for simultaneously enabling all pixels within image sensor array 705 to simultaneously capture their respective image data during a single acquisition window (exposure period). In an alternative embodiment, the shutter signal is a rolling shutter signal whereby each row, column, or group of pixels is sequentially enabled during consecutive acquisition windows.

Figure 8:
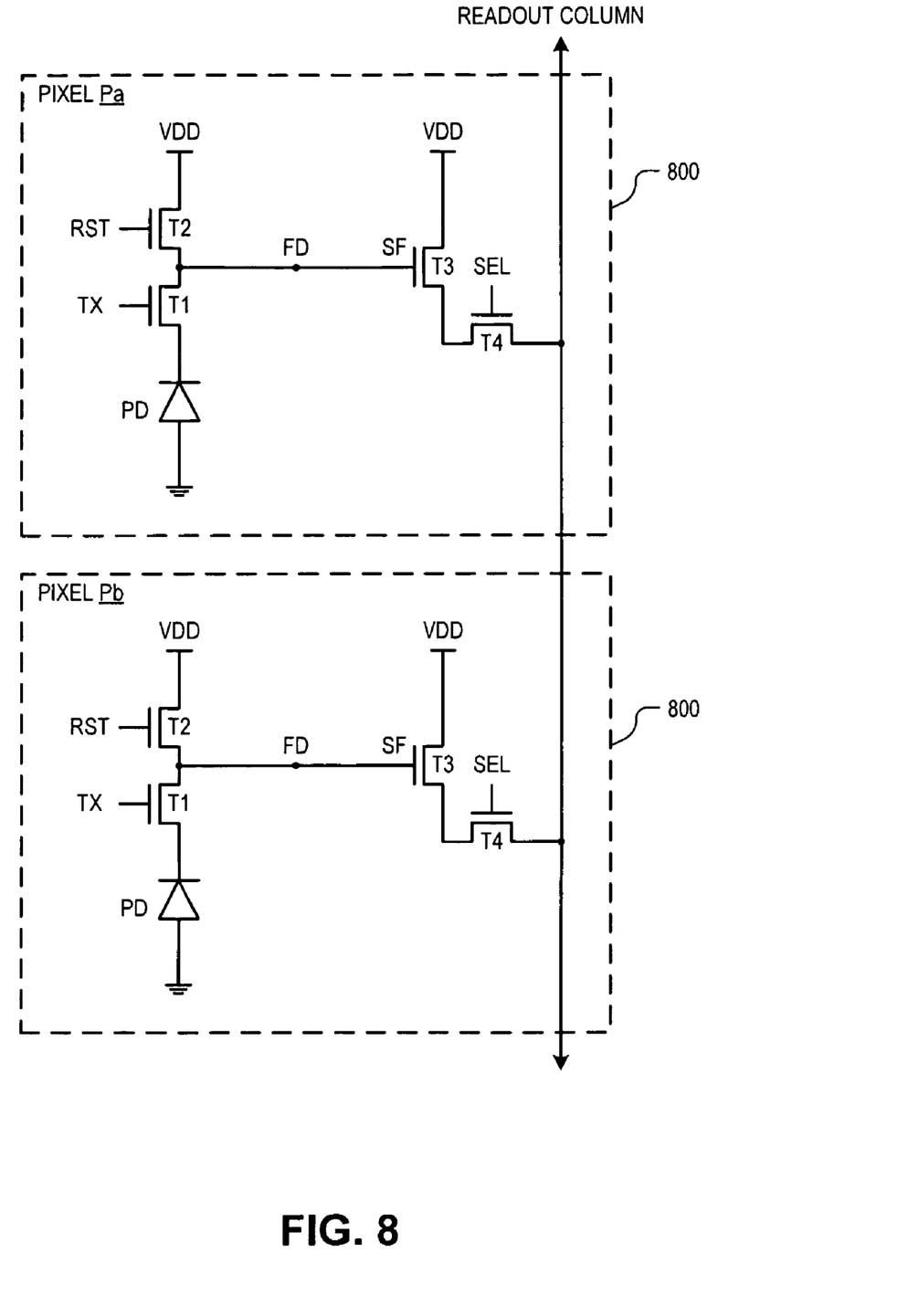
FIG. 8 is a circuit diagram illustrating sample pixel circuitry of two pixels within an image sensor array, in accordance with an embodiment of the invention.

FIG. 8 is a circuit diagram illustrating pixel circuitry 800 of two four-transistor ("4T") pixels within an image sensor array, in accordance with an embodiment of the invention. Pixel circuitry 800 is one possible pixel circuitry architecture for implementing each pixel within image sensor array 705 of FIG. 7. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 8, pixels Pa and Pb are arranged in two rows and one column. The illustrated embodiment of each pixel circuitry 800 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges.

Reset transistor T2 is coupled between a power rail VDD and the floating diffusion node FD to reset the pixel (e.g., discharge or charge the FD and the PD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance connection to the floating diffusion FD. Finally, select transistor T4 selectively couples the output of pixel circuitry 800 to the readout column line under control of a select signal SEL.

In one embodiment, the TX signal, the RST signal, and the SEL signal are generated by control circuitry 720. In an embodiment where image sensor array 705 operates with a global shutter, the global shutter signal is coupled to the gate of each transfer transistor T1 in the entire image sensor array 705 to simultaneously commence charge transfer from each pixel's photodiode PD. Alternatively, rolling shutter signals may be applied to groups of transfer transistors T1.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of fabricating a complementary metal-oxide semiconductor ("CMOS") image sensor ("CIS"), comprising:
    forming a photosensitive region and a transistor gate adjacent to the photosensitive region;
    forming first and second sidewall spacers adjacent to the transistor gate, wherein the first sidewall spacer is narrower than the second sidewall spacer; and
    forming a pinning layer over the photosensitive region after forming the first and second sidewall spacers and after the first sidewall spacer is made narrower than the second sidewall spacer.

2. The method of claim 1, wherein the transistor gate comprises a transfer gate and the first sidewall spacer is adjacent to the photosensitive region.

3. The method of claim 2, wherein the first sidewall spacer is at least half as narrow as the second sidewall spacer.

4. The method of claim 2, wherein forming the pinning layer comprises implanting dopants at an angle so that the pinning layer extends under the first sidewall spacer.

5. The method of claim 2, wherein forming the first and second sidewall spacers comprises:
    forming a spacer film over a top surface of the photosensitive region and the transistor gate;
    thinning a first portion of the spacer film over the photosensitive region and a portion of the transistor gate with a first etch;
    removing a second portion of the spacer film while retaining the first and second sidewall spacers.

6. The method of claim 5, wherein:
    the photosensitive region comprises an N type doped region within a P-epitaxial layer,
    the pinning layer comprises a P type doped layer, and
    the spacer film comprises an oxide-nitride-oxide multilayer film.

7. The method of claim 1, wherein forming the sidewall spacers and forming the pinning layer uses a single mask layer for both etching and doping.

8. The method of claim 1, further comprising:
    forming an oxide over the photosensitive region prior to forming the pinning layer; and
    implanting the pinning layer into an interface between the oxide and the photosensitive region after forming the sidewall spacers.

9. The method of claim 8, further comprising:
    annealing source and drain regions of transistor pixel circuitry within the CIS after implanting the pinning layer and forming the sidewall spacers.

10. The method of claim 8, further comprising:
    annealing source and drain regions of transistor pixel circuitry within the CIS prior to implanting the pinning layer.

11. A method of fabricating a complementary metal-oxide semiconductor ("CMOS") image sensor ("CIS"), comprising:
    forming a photosensitive region and a transistor gate adjacent to the photosensitive region;
    forming first and second sidewall spacers adjacent to the transistor gate, wherein the first sidewall spacer is narrower than the second sidewall spacer;
    forming a pinning layer over the photosensitive region after forming the first and second sidewall spacers; and
    forming an oxide over the photosensitive region prior to forming the pinning layer,
    wherein the pinning layer is implanted into an interface between the oxide and the photosensitive region after forming the sidewall spacers.

* * * * *